(12) United States Patent
Chang

(10) Patent No.: US 9,257,977 B1
(45) Date of Patent: Feb. 9, 2016

(54) DUTY-CYCLE DISTORTION SELF-CORRECTING DELAY LINE

(71) Applicant: PMC-SIERRA US, INC., Sunnyvale, CA (US)

(72) Inventor: Howard Shih Hao Chang, Vancouver (CA)

(73) Assignee: PMC-Sierra US, Inc., Sunnyvale, CA (US)

(*) Notice: Subject to any disclaimer, the term of this patent is extended or adjusted under 35 U.S.C. 154(b) by 0 days.

(21) Appl. No.: 14/581,525

(22) Filed: Dec. 23, 2014

(51) Int. Cl.
*H03L 7/00* (2006.01)
*H03K 5/156* (2006.01)
*H03K 5/06* (2006.01)
*H03K 19/21* (2006.01)

(52) U.S. Cl.
CPC .............. *H03K 5/1565* (2013.01); *H03K 5/06* (2013.01); *H03K 19/21* (2013.01)

(58) Field of Classification Search
USPC .......................................... 327/161, 231, 261
See application file for complete search history.

(56) References Cited

U.S. PATENT DOCUMENTS

| | | | | |
|---|---|---|---|---|
| 7,382,151 | B1* | 6/2008 | Truong | H04L 25/45 326/27 |
| 7,548,104 | B2 | 6/2009 | Bhowmik et al. | |
| 8,680,907 | B2 | 3/2014 | Chlipala et al. | |
| 2008/0123445 | A1* | 5/2008 | Vergnes | G11C 29/02 365/194 |
| 2008/0181046 | A1* | 7/2008 | Vergnes | G06F 13/4243 365/233.1 |
| 2009/0091360 | A1* | 4/2009 | Heinimaki | H03K 5/133 327/116 |
| 2011/0150071 | A1* | 6/2011 | Takatori | H03H 15/02 375/233 |
| 2013/0021075 | A1* | 1/2013 | Felix | G06F 1/10 327/164 |
| 2014/0314191 | A1* | 10/2014 | Yang | H04L 7/0008 375/371 |
| 2015/0054555 | A1* | 2/2015 | Berkram | H03L 7/0812 327/158 |
| 2015/0084677 | A1* | 3/2015 | Van De Graaff | H03L 7/00 327/155 |
| 2015/0188527 | A1* | 7/2015 | Francom | H03L 7/08 327/158 |

OTHER PUBLICATIONS

Garlepp, Bruno W. et al., "A Portable Digital DLL for High-Speed CMOS Interface Circuits", IEEE Journal of Solid-State Circuits, vol. 34, No. 5, May 1999, pp. 632-644.
Wang Jin-Shyan et al., "A Duty-Cycle-Distortion-Tolerant Half-Delay-Line Low-Power Fast-Lock-in All-Digital Delay-Locked Loop," IEEE Journal of solid-State Circuits, vol. 45, No. 5, May 2010, pp. 1036-1047.
Becker, Eric, "Design of an Integrated Half-Cycle Delay Line Duty Cycle Corrector Delay-Locked Loop," A thesis submitted in partial fulfillment of the requirements for the degree of Master of Science in Electrical Engineering, Boise State University, Apr. 2008, 95 pgs.

* cited by examiner

*Primary Examiner* — Adam Houston
(74) *Attorney, Agent, or Firm* — Dennis R. Haszko

(57) ABSTRACT

A duty-cycle distortion self-correcting delay line has an even number of programmable delay lines connected in series between a data signal input and a data signal output. Each programmable delay line is paired with a corresponding inverting element. A data signal propagated from the input to the output is passed un-inverted in half of the delay lines and is passed inverted in the other half of the delay lines. When the data signal is a square wave clock signal, a duty cycle distortion caused by the delay lines passing the un-inverted signal is cancelled by a duty cycle distortion caused by the delay lines passing the inverted signal. The inverting elements may be XNOR or XOR gates connected to an anti-aging signal input which, when asserted, maintains all of the delay lines in order to avoid differential aging effects leading to acquired duty cycle distortion.

20 Claims, 4 Drawing Sheets

DUTY-CYCLE DISTORTION SELF-CORRECTING DELAY LINE

FIELD OF THE INVENTION

The present disclosure relates to very-large-scale integration (VLSI) complementary metal-oxide-semiconductor (CMOS) digital circuit clock signal delay lines.

BACKGROUND

Very-large-scale integration (VLSI) is a method of producing an integrated circuit having a very large number of transistors. Complementary metal-oxide-semiconductor (CMOS) is one technique for making integrated circuits such as microprocessors, memory, and digital logic circuits. Many digital logic circuits are implemented using p-type metal-oxide-semiconductor logic (PMOS) and n-type metal-oxide-semiconductor logic (NMOS) which respectively use p-type and n-type metal-oxide-semiconductor field effect transistors (MOSFETs).

Typical synchronous digital logic circuits employ a clock signal to synchronize circuit actions. A typical clock signal takes the form of a square wave having a fixed duty cycle and frequency, wherein the duty cycle designates the ratio of the pulse width to the pulse period, and a clock pulse designates a single period of the square wave. Circuits synchronized to the clock signal respond to one or more "transition edges", which may include either the rising edge, the falling edge, or both the rising and falling edges of the clock signal square wave. When a circuit is responsive to both the rising and falling edges, it is said to operate at a double data rate (DDR).

A delay line is a common design technique used to adjust clock or data edges in a digital circuit. A delay line is typically a regular structure comprising a chain of delay elements such as buffers. The signal is delayed by the length of the delay element thus enabling adjustment of the transition edge or edges to the desired timing window. Usually, the amount of adjustment is process, voltage, and temperature dependent, and therefore delay lines are sometimes programmable wherein the effective number of delay elements in the chain can be adjusted via external controls. The length of a delay line may be expressed in terms of the number of delay elements engaged, or "delay taps".

Duty cycle distortion (DCD) is a variance between the duty cycle of a clock pulse at the destination as compared to the duty cycle at the source. DCD occurs when the propagation delay of the rising edge is different from the propagation delay of the falling edge. DCD can be a result of aging including a degradation of device performance over time due to effects such as electro-migration (EM) or negative bias temperature instability (NBTI). The speeds of aging for PMOS and NMOS transistors are non-symmetrical and are dependent of the state of the transistors. For example, a metal-oxide-semiconductor (MOS) ages faster when it is "on" than when it is "off".

Duty cycle distortion is a concern when the delay line is used on a clock signal and both rising and falling edges are used, as in a double data rate interface. In such a case, a delay line is typically used to adjust the clock edges to align with data edges within the budgeted timing window. If DCD is too large (i.e., propagation delay of the rising edge is very different from that of falling edge), it may not be possible to align both rising and falling edges of the clock to data. In order to meet the timing specification, DCD must be minimized.

A single delay element in a delay line can be designed with minimal DCD—that is, the propagation delay of a rising edge is equal to the propagation delay of a falling edge within predefined tolerances—and is thus said to be balanced, for a particular process corner (meaning an extreme of possible circuit fabrication parameters). It is, however, difficult to maintain minimal DCD across all process corners. For example, if a delay element is balanced in the slow-slow (SS) or fast-fast (FF) process corner, DCD usually increases in the fast-slow (FS) or slow-fast (SF) process corners. Furthermore, DCD can accumulate and become very large as the delay line becomes longer. For example, a 0.5 picosecond DCD in a single delay element can add up to hundreds of picoseconds when the delay line is hundreds of elements long.

Moreover, due to the non-symmetrical nature of the aging effect for PMOS and NMOS transistors, a perfectly balanced delay line may still develop DCD over time.

It remains desirable, therefore, to develop improved techniques for reducing duty cycle distortion in digital circuit clock signal delay lines.

SUMMARY

Embodiments disclosed herein overcome or ameliorate disadvantages of prior methods, provide additional capabilities or advantages, or provide alternative means for producing desirable results.

A duty-cycle distortion self-correcting delay line may have an even number of programmable delay lines connected in series between a data signal input and a data signal output. Each programmable delay line is paired with a corresponding inverting element. A data signal propagated from the input to the output is passed un-inverted in half of the delay lines and is passed inverted in the other half of the delay lines. When the data signal is a square wave clock signal, a duty cycle distortion caused by the delay lines passing the un-inverted signal is cancelled by a duty cycle distortion caused by the delay lines passing the inverted signal.

The inverting elements may be XNOR or XOR gates connected to an anti-aging signal input which, when asserted, maintains all of the delay lines in order to avoid differential aging effects leading to acquired duty cycle distortion.

Each additional delay element in the programmable delay lines may be selectively engaged in a ring pattern such that a number of delay elements in any one of the programmable delay lines differs from a number of delay elements in any other one of the programmable delay lines by one at most.

The general outline provided above enables a better understanding of the detailed description of embodiments which follows. Such embodiments include additional features and advantages, and it will be appreciated by persons of ordinary skill in the art that the particular embodiments described below may be modified or built upon to perform the same functions and provide the same results set forth herein while not departing from the spirit and scope of the subject matter set forth in the appended claims.

BRIEF DESCRIPTION OF THE DRAWINGS

Embodiments of the present disclosure will now be described, by way of example only, with reference to the attached Figures.

DETAILED DESCRIPTION

Particular embodiments will now be described in a context of delay lines for digital circuit clock signals. It will be appreciated by persons of ordinary skill in the art, however, that the principles set forth herein may be applied to adapt the embodiments to any related or similar context.

Figure 1:
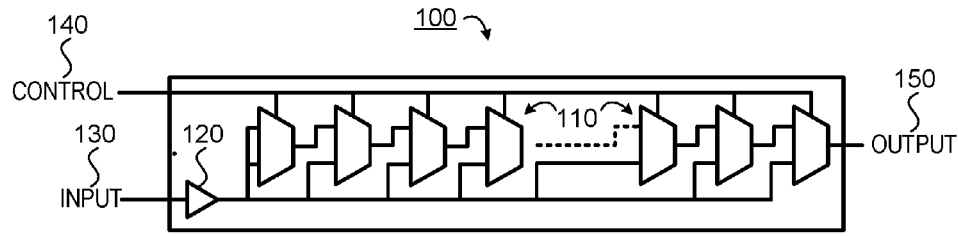
FIG. 1 is a block diagram of one embodiment of a programmable delay line.
Figure 2:
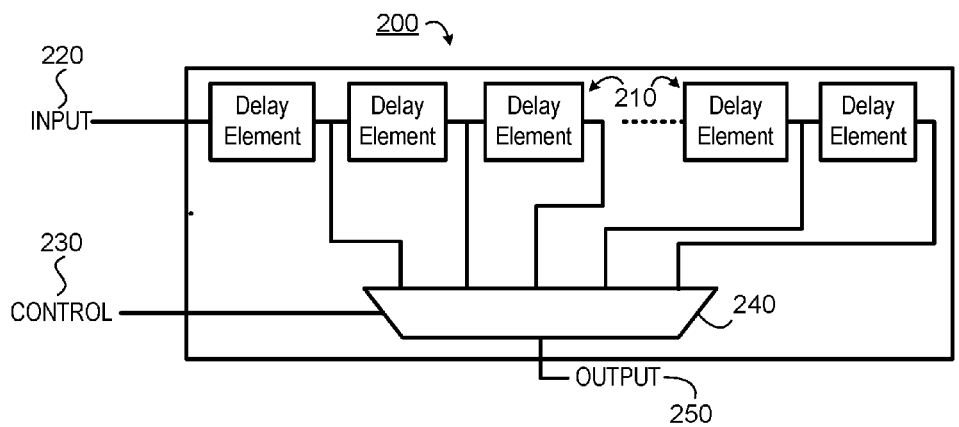
FIG. 2 is a block diagram of another embodiment of a programmable delay line.
Figure 3:
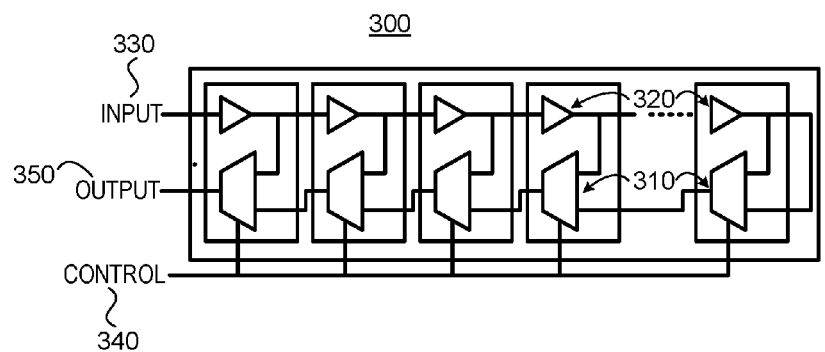
FIG. 3 is a block diagram of another embodiment of a programmable delay line.

A programmable delay line may be implemented in many different ways. FIGS. 1, 2, and 3 illustrate three different implementations of programmable delay lines.

For example, FIG. 1 shows a programmable delay line 100 having a chain of multiplexers 110 serving as delay elements, each of which receives a signal from buffer 120 which receives a signal from data signal input 130, and a control signal 140. The chain of multiplexers 110 outputs to a data signal output 150. The control signal 140 controls a number of one or more consecutive multiplexers 110 immediately preceding the data signal output 150 to select the input connected to the preceding multiplexer 110 as opposed to the input connected to buffer 120. Thus, the control signal 140 controls the length of the sub-chain of multiplexers 110 which receives and propagates signal from buffer 120 to the data signal output 150.

FIG. 2 shows another programmable delay line 200 having an array of delay elements 210 connected in a chain to an data signal input 220. A control signal 230 controls a multiplexer 240 connected to a data signal output 250 to select as input the output of one of the array of delay elements 210. Thus, the control signal 230 controls the length of the sub-chain of delay elements 210 which a signal from data signal input 220 traverses before reaching multiplexer 240 and data signal output 250.

FIG. 3 shows yet another programmable delay line 300 similar to programmable delay line 100. Programmable delay line 300 has a chain of multiplexers 310 each receiving a signal from a corresponding buffer 320 connected in a chain to an data signal input 330. Each multiplexer 310 also receives a control signal 340. The control signal 340 controls a number of one or more consecutive multiplexers 310 immediately preceding the data signal output 350 to select the input connected to the preceding multiplexer 310 as opposed to the input connected to its corresponding buffer 320. Thus, the control signal 340 controls the length of the sub-chain of multiplexers 310 and corresponding buffers 320 which receives and propagates signal from data signal input 330 to data signal output 350. Programmable delay line 300 is thus similar to programmable delay line 100, except in that each multiplexer 310 is associated with a corresponding buffer 320 which bears the load of the corresponding multiplexer 310, while in programmable delay line 100, the single buffer 120 bears the load of the entire chain of multiplexers 110 selectively connected to the buffer 120 by the control signal 140.

The techniques disclosed herein are not restricted to any specific implementation of programmable delay line. The technique converts or employs any type of delay line into one that may automatically minimize duty cycle distortion in any process, temperature, and voltage corners.

Figure 4:
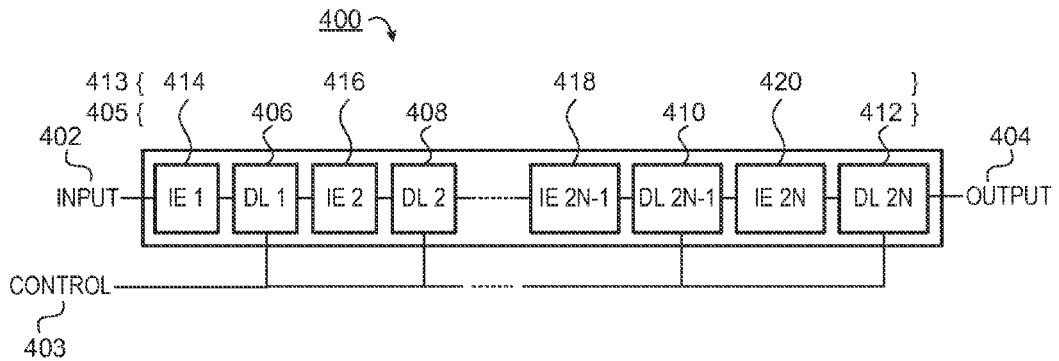
FIG. 4 is a block diagram of one embodiment of a balanced programmable delay line wherein inverting elements precede corresponding delay lines.

A balanced programmable delay line 400 adapted for self-correcting duty cycling distortion is shown in FIG. 4. The balanced programmable delay line 400 has a data signal input 402, an data signal output 404, and an even number 2N of delay lines 405 including a first delay line 406, a second delay line 408, and so on, up to a 2N−1th delay line 410, and finally a 2Nth delay line 412. Each delay line 405 may receive a control signal 403 for selectively engaging a number of elements, or taps, in each delay line 405, as described above.

The balanced programmable delay line 400 further has an even number 2N of inverting elements 413 including a first inverting element 414, a second inverting element 416, and so on, up to a 2N−1th inverting element 418, and finally a 2Nth inverting element 420.

The first inverting element 414 may be connected to the data signal input 402 and the first delay line 406, and precede the first delay line 406 in a path between the data signal input 402 and the data signal output 404, the second inverting element 416 may be connected to and follow the first delay line 406 and be connected to and precede the second delay line 408 in the path between the data signal input 402 and the data signal output 404, and so forth, up to the 2N−1th inverting element 418 which is connected to and follows a 2N−2th delay line (not shown) and is connected to and precedes the 2N−1th delay line 410, and a 2Nth inverting element 420 which is connected to and follows the 2N−1th delay line 410 and is connected to and precedes the 2Nth delay line 412 which is connected to the data signal output 404. Thus, each inverting element 413 may be connected to and precede a corresponding delay line 405 in the path from the data signal input 402 to the data signal output 404.

In the balanced programmable delay line 400, a signal received at data signal input 402 is propagated to the data signal output 404 as follows. The signal is inverted by the first inverting element 414, passed with delay by the first delay line 406, inverted by the second inverting element 416, passed with delay by the second delay line 408, and so on, until it is received and inverted by the 2N−1th inverting element 418, and then passed with delay by the 2N−1th delay line 410, and then inverted by the 2Nth inverting element 420, and then passed with delay by the 2Nth delay line 412, and then passed to data signal output 404. Half of the delay lines 405 receive the uninverted signal, while the other half of the delay lines 405 receive the inverted signal. As such, if the data signal input 402 is a square wave pulse of a clock signal, for example, one half of the delay lines 405 propagate a rising edge, and the other half of the delay lines 405 propagate a falling edge. Consequently, the respective duty cycle distortions in the first and second halves of the delay lines 405 are opposite and thus cancel each other out.

Figure 5:
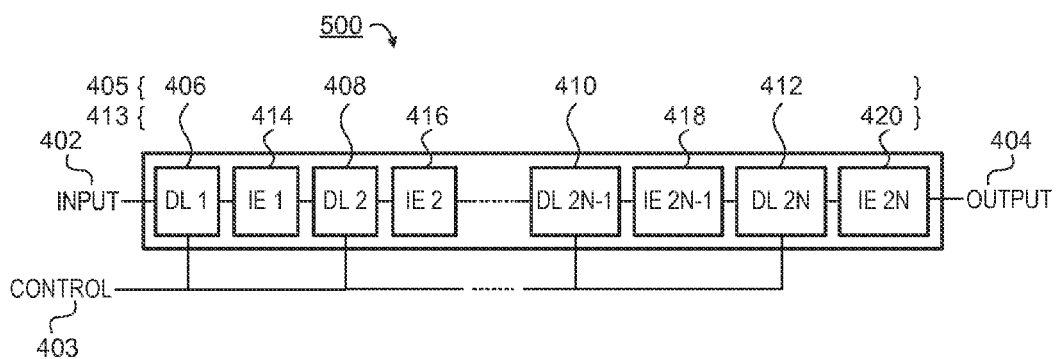
FIG. 5 is a block diagram of one embodiment of a balanced programmable delay line wherein inverting elements follow corresponding delay lines.

As indicated above, in balanced programmable delay line 400 each inverting element 413 may be connected to and precede a corresponding delay line 405 in the path from the data signal input 402 to the data signal output 404. Alternatively, as shown in FIG. 5, each inverting element 413 in balanced programmable delay line 500 may be connected to and follow a corresponding delay line 405 in the path between the data signal input 402 and the data signal output 404, and balanced programmable delay line 500 is otherwise identical to balanced programmable delay line 400, and possesses substantially the same functionality and produces substantially the same result as balanced programmable delay line 400. In all the embodiments of balanced programmable delay line 400 described herein, therefore, it will be understood that the inverting elements 413 may be connected to and follow a corresponding delay line 405 as in the case of balanced programmable delay line 500, as opposed to being connected to and preceding the corresponding delay line 405 as in balanced programmable delay line 400, and thus such alternative will not be repeated in connection with each embodiment for the sake of efficient description.

Figure 6:
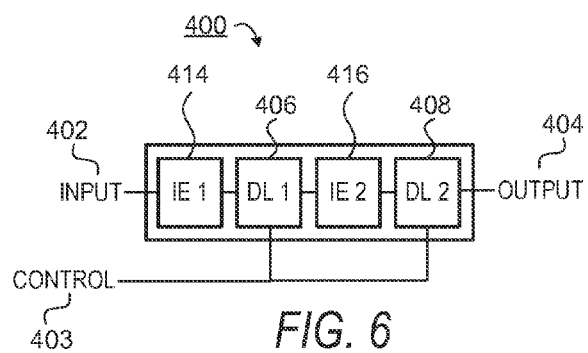
FIG. 6 is a block diagram of one embodiment of a balanced programmable delay line based on the embodiment of FIG. 4 having two delay lines and two corresponding inverting elements.

In all the embodiments of balanced programmable delay line 400 described herein, it will be understood that the balanced programmable delay line 400 may have any even number of delay lines 405 and corresponding inverting elements 413, including only two delay lines 406, 408 and two corresponding inverting elements 414, 416 as in the embodiment shown in FIG. 6, and thus such alternatives will not be repeated in connection with each embodiment for the sake of efficient exposition.

In general, control signal 403 controls the number of delay taps engaged in each delay line 405. The control signal 403 may be configured to engage only the same number of delay taps in each delay line 405, or it may be configured to engage a first number of delay taps in one delay line 405 which is different from a second number of delay taps in another delay line 405. In general, if control signal 403 is configured to engage a number of delay taps which is not evenly divisible by 2N, wherein the balanced programmable delay line 400 has 2N delay lines 405, then one or more of the delay lines 405 may have engaged a number of delay taps which is different from a number of delay taps engaged in another delay line 405.

Figure 7:
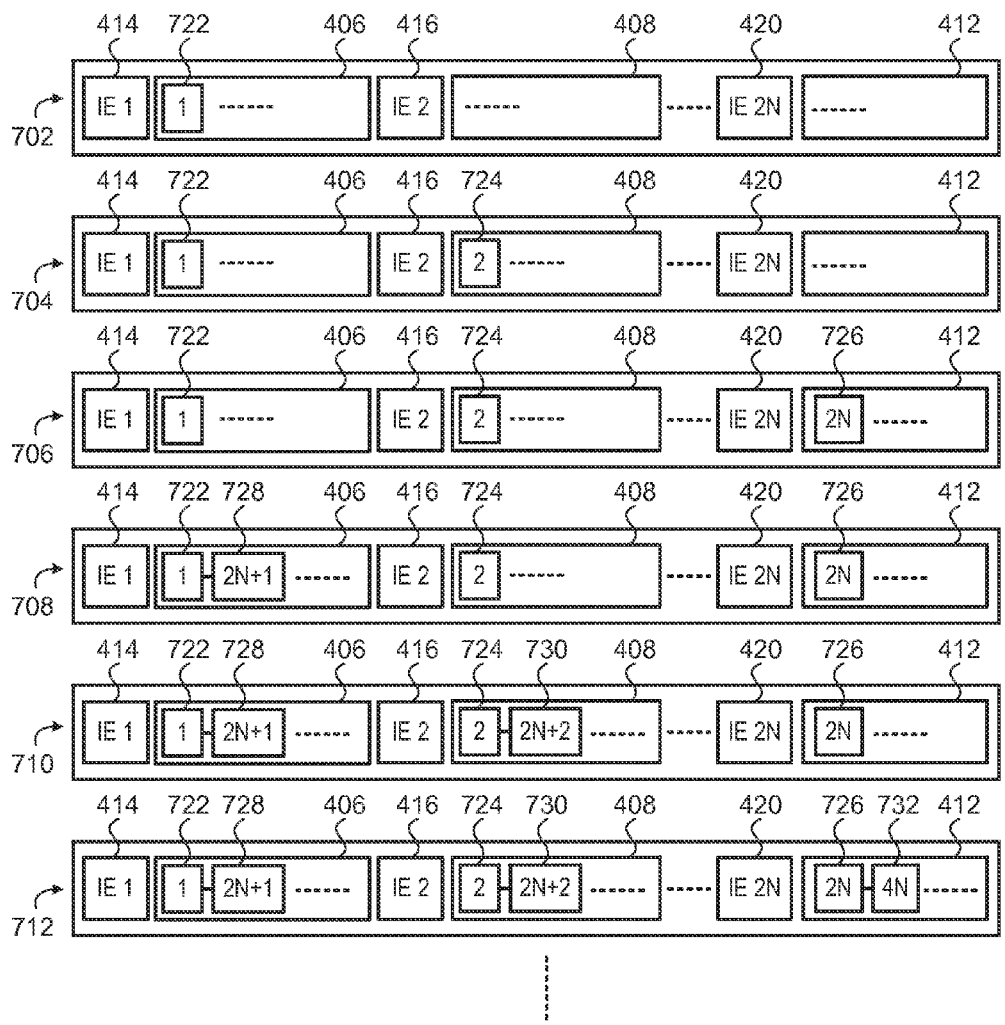
FIG. 7 is a block diagram of a series of balanced programmable delay lines based on the embodiment of FIG. 4, illustrating a method of allocating delay elements.

As shown in FIG. 7, control signal 403 (not shown) may be configured so as to engage each additional delay tap in the balanced programmable delay line 400 in a ring sequence. FIG. 7 shows a number of configurations of balanced programmable delay line 400 wherein a different number of delay taps are engaged. (Some of the elements shown in FIG. 4 are omitted from FIG. 7 for clearer illustration of these configurations, but the various configurations of the balanced programmable delay line 400 shown in FIG. 7 should be understood as including the omitted elements nevertheless.) The configurations include a first configuration 702 with one delay tap engaged, a second configuration 704 with two delay taps engaged, a third configuration 706 having three delay taps engaged, a fourth configuration 708 having four delay taps engaged, a fifth configuration 710 having five delay taps engaged, and a sixth configuration 712 having six delay taps engaged. The delay taps may be engaged in a sequence beginning with the first delay tap 722 in the first delay line 406, the second delay tap 724 in the second delay line 408, up to a 2Nth delay tap 726 in the 2Nth delay line 412, and then return to activate a 2N+1th delay tap 728 in the first delay line 406, a 2N+2th delay tap 730 in the second delay line 408, up to a 4Nth delay tap 732 in the 2Nth delay line 412, and so on. By following this pattern, a difference in the number of delay taps engaged between any two delay lines 405 is at most one.

Similarly, if, as shown in FIG. 6, balanced programmable delay line 400 has only two delay lines 406, 408 and two corresponding inverting elements 414, 416, then the control signal 403 may be configured so as to engage each additional delay tap in programmable delay lines 406, 408 alternatingly.

If a number of engaged delay taps of a first half of the delay lines receiving an uninverted signal is equal to a number of engaged delay taps of a second half of the delay lines receiving an inverted signal, then the respective duty cycle distortions of the first and second halves of the delay lines 405 are opposite and thus cancel each other out.

If, however, a first number of engaged delay taps of a first half of the delay lines receiving an uninverted signal is unequal to a second number of engaged delay taps of a second half of the delay lines receiving an inverted signal, and in particular the first number differs from the second number by one, then the duty cycle distortion may include a contribution by the additional delay element. Otherwise, the duty cycle distortion which remains may be due to a difference in loading at the end of each delay line or a difference in transition time (slew rate) at the beginning of each delay line.

Figure 8:
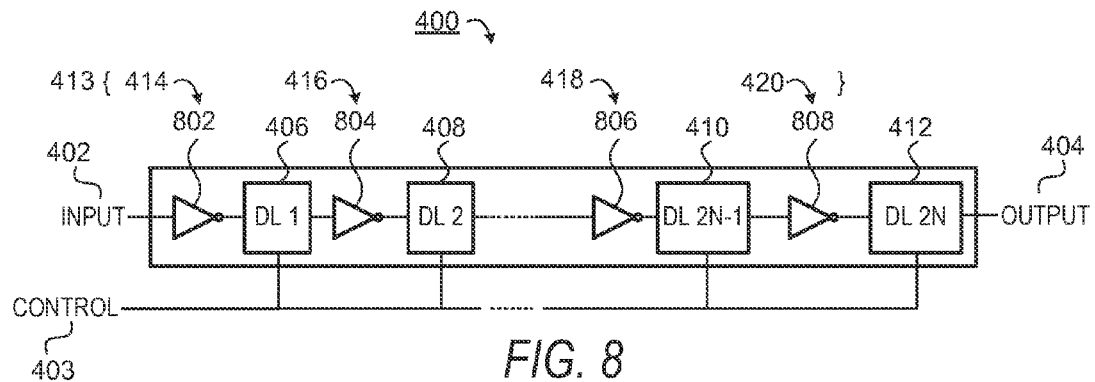
FIG. 8 is a block diagram of one embodiment of a balanced programmable delay line based on the embodiment of FIG. 4 wherein the inverting elements are inverters.

Each one of inverting elements 413 may be implemented in any suitable way, and in particular may include any inverting circuit element whose selection may depend on design parameters. For example, as shown in FIG. 8, each inverting element 413 may be implemented as an inverter, such that first inverting element 414, second inverting element 416, and so on, up to 2N−1th inverting element 418, and lastly 2Nth inverting element 420, are implemented as first inverter 802, second inverter 804, and so on, up to 2N−1th inverter 806, and lastly 2Nth inverter 808.

As noted above, duty cycle distortion may be caused in part by aging of the delay lines including the delay taps. As such, if the balanced programmable delay line 400 receives a signal at data signal input 402 which is constantly toggling, and thus the delay lines 405 receive signals which are likewise constantly toggling, they will experience equal or substantially similar aging and their respective contributions to the duty cycle distortion will remain equal or substantially similar and thus continue to cancel out over time. If, however, the signal received at data signal input 402 is not constantly toggling, and instead remains high or low for extended or substantially unequal periods of time, such as when the balanced programmable delay line 400 is idle, for example, then the respective aging experienced by a first half of the delay lines 405 held in an uninverted state may be different from the aging experienced by a second half of the delay lines 405 held in an inverted state, thus resulting afterward in imperfect cancellation of the duty cycle distortion. This may result at least in part from the non-symmetrical nature of aging effects on PMOS and NMOS transistors, with the result that duty cycle distortion for different delay lines 405 starts to diverge if they stay at constant but opposite states for extended periods of time.

Figure 9:
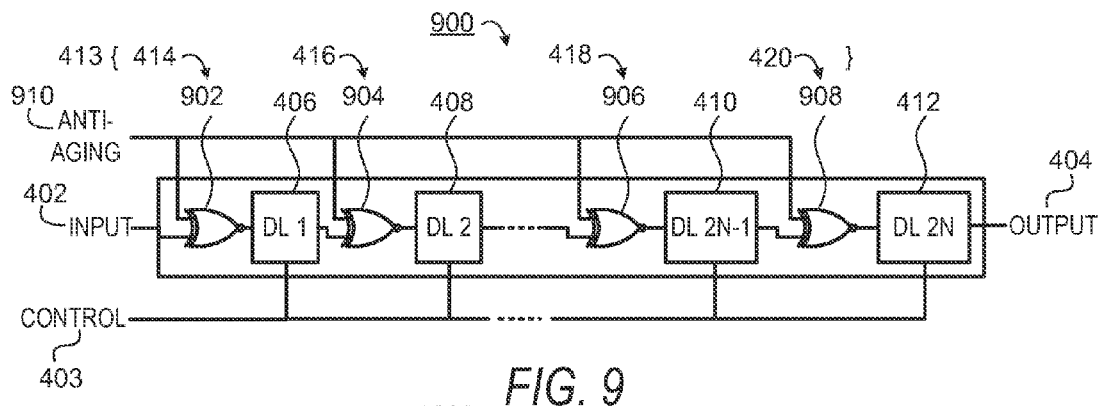
FIG. 9 is a block diagram of one embodiment of a balanced programmable delay line wherein the inverting elements are XNOR gates and including an anti-aging circuit.

Thus, FIG. 9 shows a balanced programmable delay line 900 which is identical to balanced programmable delay line 400 except as follows. In the programmable delay line 900, each inverting element 413 is implemented as an XNOR gate, such that first inverting element 414, second inverting element 416, and so on, up to 2N−1th inverting element 418, and lastly 2Nth inverting element 420, are implemented as first XNOR gate 902, second XNOR gate 904, and so on, up to 2N−1th XNOR gate 906, and lastly 2Nth XNOR gate 908. In addition to receiving data signal input 402 and sending data signal output 404, the programmable delay line 900 also has an anti-aging signal input 910 connected to one of the inputs of each of the XNOR gates 902, 904, 906, 908.

When the anti-aging input 910 is not asserted (is held low), the XNOR gates 902, 904, 906, 908 function identically to inverting elements, such as inverters 802, 804, 806, 808, and thus alternating uninverted and inverted signals are propagated across the delay lines 405, as is the case generally in balanced programmable delay line 400. When the anti-aging input 910 is asserted (is held high), the XNOR gates 902, 904, 906, 908 pass the signal at their respective inputs, and thus the respective signals propagated across the delay lines 405 are the same. In this way, by asserting the anti-aging input 910 while the balanced programmable delay line 900 is idle, for example, any aging experienced by the respective delay lines 405 may be the same, and thus a difference in the respective duty cycle distortions is avoided.

A balanced programmable delay line may be implemented using any desired components or designs to provide the functionality described herein. For example, a balanced programmable delay line may be implemented with an anti-aging circuit, as described above, wherein the inverting elements are implemented as XOR gates instead of XNOR gates.

Figure 10:
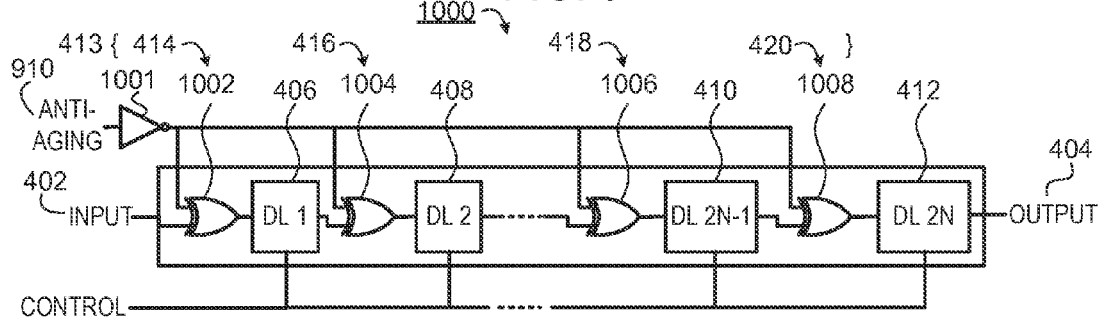
FIG. 10 is a block diagram of one embodiment of a balanced programmable delay line wherein the inverting elements are XOR gates and including an anti-aging circuit.

Thus, as shown in FIG. 10, balanced programmable delay line 1000 may be identical to balanced programmable delay line 900 except as follows. In the programmable delay line 1000, each inverting element 413 is implemented as an XOR gate, such that first inverting element 414, second inverting element 416, and so on, up to 2N−1th inverting element 418, and lastly 2Nth inverting element 420, are implemented as first XOR gate 1002, second XOR gate 1004, and so on, up to 2N−1th XOR gate 1006, and lastly 2Nth XOR gate 1008. In addition to receiving input 402 and sending data signal output 404, the programmable delay line 1000 also has an anti-aging signal input 910 connected to an inverting element, which may be an inverter 1001, which is then connected to one of the inputs of each of the XOR gates 1002, 1004, 1006, 1008.

When the anti-aging input 910 is not asserted (is held low), the inverter 1001 output is held high, and thus the XOR gates 1002, 1004, 1006, 1008 function identically to inverting elements, such as inverters 802, 804, 806, 808, and thus alternating uninverted and inverted signals are propagated across the delay lines 405, as is the case generally in balanced programmable delay line 400. When the anti-aging input 910 is asserted (is held high), the inverter 1001 output is held low, the XOR gates 1002, 1004, 1006, 1008 pass the signal at their respective inputs, and thus the respective signals propagated across the delay lines 405 are the same. Thus, as in the case of balanced programmable delay line 900, by asserting the anti-aging input 910 while the balanced programmable delay line 1000 is idle, for example, any aging experienced by the respective delay lines 405 may be the same, and thus a difference in the respective duty cycle distortions is avoided.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

Embodiments of the invention can be represented as a software product stored in a machine-readable medium (also referred to as a computer-readable medium, a processor-readable medium, or a computer usable medium having a computer-readable program code embodied therein). The machine-readable medium can be any suitable tangible medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention can also be stored on the machine-readable medium. Software running from the machine-readable medium can interface with circuitry to perform the described tasks.

The above-described embodiments are intended to be examples only. Alterations, modifications and variations can be effected to the particular embodiments by those of skill in the art. The scope of the claims should not be limited by the particular embodiments set forth herein, but should be construed in a manner consistent with the specification as a whole.

What is claimed is:

1. A delay line comprising a data signal input, a data signal output, and, connected in series between the data signal input and the data signal output:
    a first programmable delay line;
    a first inverting element following the first programmable delay line;
    a second programmable delay line following the first inverting element; and
    a second inverting element either preceding the first programmable delay line or following the second programmable delay line.

2. The delay line according to claim 1 further comprising a control signal input connected to the first programmable delay line and the second programmable delay line selectively to engage a first number of delay elements in the first programmable delay line and a second number of delay elements in the second programmable delay line.

3. The delay line according to claim 2, wherein the first number of delay elements is equal to the second number of delay elements.

4. The delay line according to claim 2, wherein the first number of delay elements is unequal to the second number of delay elements.

5. The delay line according to claim 4, wherein the first number of delay elements differs from the second number of delay elements by one delay element.

6. The delay line according to claim 2, wherein each additional delay element is engaged alternatively in the first programmable delay line and the second programmable delay line.

7. The delay line according to claim 1, wherein the first inverting element is a first inverter and the second inverting element is a second inverter.

8. The delay line according to claim 1, wherein the first inverting element is a first XNOR gate, and the second inverting element is a second XNOR gate.

9. The delay line according to claim 8 further comprising an anti-aging signal input connected to a respective input of each of the first XNOR gate and the second XNOR gate.

10. The delay line according to claim 9, wherein, when an anti-aging signal is asserted on the anti-aging signal input, the first XNOR gate and the second XNOR gate respectively hold the first programmable delay line and the second programmable delay line in a common state.

11. The delay line according to claim 9, wherein, when an anti-aging signal is not asserted on the anti-aging signal input, the first XNOR gate and the second XNOR gate each function as inverters.

12. The delay line according to claim 1, wherein the first inverting element is a first XOR gate, and the second inverting element is a second XOR gate.

13. The delay line according to claim 12 further comprising an anti-aging signal input connected to an inverter connected to a respective input of each of the first XOR gate and the second XOR gate.

14. The delay line according to claim 13, wherein, when an anti-aging signal is asserted on the anti-aging signal input, the first XOR gate and the second XOR gate respectively hold the first programmable delay line and the second programmable delay line in a common state.

15. The delay line according to claim 13, wherein, when an anti-aging signal is not asserted on the anti-aging signal input, the first XOR gate and the second XOR gate each function as inverters.

16. The delay line according to claim 1, wherein the first programmable delay line and the second programmable delay line are identical in circuit structure and layout.

17. A delay line comprising a data signal input, a data signal output, and, connected in series between the data signal input and the data signal output, an even number of programmable delay lines all either preceded by or followed by respective corresponding inverting elements.

18. The delay line according to claim 17 further comprising a control signal input connected to each of the programmable delay lines selectively to engage respective numbers of delay elements in the programmable delay lines.

19. The delay line according to claim 18, wherein the control signal input is configured to engage each additional delay element in a ring pattern.

20. A method of controlling the delay line according to claim 18, the method comprising asserting a control signal on the control signal input to engage each additional delay element in the delay line in a ring pattern.

* * * * *